(12) United States Patent
Linke et al.

(10) Patent No.: US 7,807,920 B2
(45) Date of Patent: Oct. 5, 2010

(54) CONCENTRATED SOLAR PHOTOVOLTAIC MODULE

(75) Inventors: Edward J. Linke, Milford, CT (US); Francisco A. Middleton, Sandy Hook, CT (US)

(73) Assignee: Opel, Inc., Shelton, CT (US)

(*) Notice: Subject to any disclaimer, the term of this patent is extended or adjusted under 35 U.S.C. 154(b) by 353 days.

(21) Appl. No.: 11/928,154

(22) Filed: Oct. 30, 2007

(65) Prior Publication Data

US 2009/0107541 A1  Apr. 30, 2009

(51) Int. Cl.
*H02N 6/00* (2006.01)
*H01L 31/00* (2006.01)
*H01L 31/042* (2006.01)

(52) U.S. Cl. .................... 136/246; 136/251; 136/259
(58) Field of Classification Search ......... 136/243–244, 136/246, 251, 259
See application file for complete search history.

(56) References Cited

U.S. PATENT DOCUMENTS

| | | | |
|---|---|---|---|
| 2,951,222 A * | 8/1960 | Marie ........................ | 333/249 |
| 4,045,246 A | 8/1977 | Mlavsky et al. | |
| 4,383,891 A * | 5/1983 | Clavier ...................... | 202/234 |
| 4,511,755 A | 4/1985 | Mori | |
| 4,830,678 A | 5/1989 | Todorof et al. | |
| 4,839,512 A * | 6/1989 | Speck ..................... | 250/231.1 |
| 5,118,361 A | 6/1992 | Fraas et al. | |
| 5,460,659 A | 10/1995 | Krut | |
| 5,505,789 A | 4/1996 | Fraas et al. | |
| 5,714,012 A * | 2/1998 | Murata et al. ................ | 136/247 |
| 5,990,415 A | 11/1999 | Green et al. | |
| 6,020,554 A | 2/2000 | Kaminar et al. | |
| 6,365,824 B1 * | 4/2002 | Nakazima et al. ............ | 136/251 |
| 6,399,874 B1 | 6/2002 | Olah | |
| 6,483,093 B1 | 11/2002 | Takemura et al. | |
| 2002/0148497 A1 | 10/2002 | Sasaoka et al. | |
| 2004/0216734 A1 | 11/2004 | Lawheed | |
| 2007/0289622 A1 * | 12/2007 | Hecht ......................... | 136/246 |
| 2009/0260674 A1 * | 10/2009 | Linke ......................... | 136/246 |

FOREIGN PATENT DOCUMENTS

WO    WO2006/114457    11/2006

OTHER PUBLICATIONS

Sol3G HCPV Systems Technical Report, Ricard Pardell, Dec. 6, 2007, 35 pages.
Nonimaging Fresnel Lens Concentrator—The Prototype, Ralf Leutz, Akio Suzuki, Atsushi Akisawa and Takao Kasiwagi, May 1999.

* cited by examiner

*Primary Examiner*—Basia Ridley
*Assistant Examiner*—Lindsey Bernier
(74) *Attorney, Agent, or Firm*—Gordon & Jacobson, PC

(57) ABSTRACT

A solar photovoltaic module containing a housing that supports an array of photovoltaic cells and corresponding light guides. The housing includes a base member having a generally planar support surface and two side walls projecting from the support surface. Two side panels detachably connect to the side walls, and a top panel detachably connects to the side panels. The top panel includes a plurality of concentrating lenses that focus incident solar radiation into the inside of the housing towards the light guide. The light guides are disposed between the corresponding concentrating lenses and photovoltaic cells such that the concentrating lenses and light guides work together to direct light onto the photovoltaic cells. At least one retaining member interfaces to the light guides and applies a downward force that biases the respective light guides toward the corresponding photovoltaic cells.

26 Claims, 7 Drawing Sheets

CONCENTRATED SOLAR PHOTOVOLTAIC MODULE

BACKGROUND OF THE INVENTION

1. Field of the Invention

This invention relates generally to the field of photovoltaic systems. More particularly, this invention relates to concentrated solar photovoltaic systems and parts thereof.

2. State of the Art

Terrestrial solar photovoltaic systems convert solar insolation into electrical energy using photovoltaic cells. The amount of electrical energy that a photovoltaic cell produces is proportional to the intensity of the insolation it receives and the surface area of the cell. Photovoltaic cells are typically made from various semiconductor materials such as, but not limited to, silicon or gallium arsenide. Single junction photovoltaic cells, which are typically realized by silicon material, are less efficient at converting solar isolation to electrical energy, and thus require a larger size and a greater number of cells to provide a required amount of electrical output. Multiple junction (MJC) photovoltaic cells, which are typically realized by gallium arsenide material, by contrast, are more efficient, and require less size and a smaller number of cells to provide a required amount electrical output.

Concentrating the insolation received by a photovoltaic cell can effectively decrease costs by increasing the electrical output of the photovoltaic cell. One form of concentration is realized by a concentrator lens and a light guide that cooperate to channel insolation to the photovoltaic cell. These components must be manufactured and assembled with tight tolerances in order to properly channel sunlight to the photovoltaic cell. In addition, the photovoltaic cell heats up as it receives insolation. This heat limits the photovoltaic cell's efficiency. A number of housings and mounting devices have been disclosed in the art that support photovoltaic cells and associated concentration mechanisms. Among these are U.S. Pat. No. 6,399,874; PCT Pub. No. WO 2006/114457 A1; and U.S. Pat. No. 6,483,093. These photovoltaic cell systems presently rely on an adhesive bond between the light guide and the photovoltaic cell to mechanically support the secondary optical device in place above the photovoltaic cell. The adhesive bond thus takes on a mechanical load due to the weight of the light guide and the lateral and/or sheering forces that arise from the transportation, positioning, or movement of the system.

SUMMARY OF THE INVENTION

The present invention is directed to a solar photovoltaic module to be used for the generation of power suitable for terrestrial applications, including power grid fields, rooftop systems, private or public utilities, and commercial and residential building applications. The solar photovoltaic module includes a housing having a base member, two side panels detachably connected to the base member, a top panel detachably connected to the side panels, and two end panels detachably connected to the base member and/or the side panels. The top panel contains an integral array of concentrating lenses that focus solar energy through the interior of the housing to an array of photovoltaic cells via corresponding light guides mounted within the housing. The base member of the housing mechanically supports the array of photovoltaic cells and corresponding light guides. The concentrating lenses, light guides, and photovoltaic cells cooperate to convert solar radiation incident on the concentrating lens to electrical energy for output.

In the preferred embodiment, the base member includes a generally planar support surface having one or more recesses that receive the photovoltaic cells of the module. A plurality of cooling fins extend downward opposite the support surface and run along the length of the base member. The cooling fins dissipate heat away from the photovoltaic cells. The base member also has two side walls that angularly extend from opposite edges of the support surface, and two shoulders extending from the bottom of the side walls to further assist with supporting the side panels. The side walls project upward from opposite edges of the support surface at obtuse angles, preferably in a range between sixty to seventy-five degrees, and most preferably, between sixty-three to seventy degrees. The shoulders preferably attach at right angles to the side walls, which creates a support surface perpendicular to the bottom of the side panels as the side panels are mounted parallel to an exterior surface of the side wall. The side panels are mounted to the side walls by a plurality of self tapping screws or other fasteners that pass through holes or slots in the side panels and fasten the side panels to the side walls. The side walls preferably include a rib which defines a channel accessible for receiving the set screws or other fasteners.

The top panel is attached to and supported by the side panels, and is mounted substantially parallel to the support surface such that the concentrating lenses are parallel with the support surface. End panels are mounted to respective ends of the base member, perpendicular to the direction of the array of photovoltaic cells. The array of photovoltaic cells and light guides are thus enclosed by the base member, side panels, top panel, and end panels. Sealing adhesives are applied to the enclosed housing to keep out water, dust, or other particles. The housing also preferably contains a valve that regulates air pressure inside the housing in accordance with the atmospheric pressure, which varies as the ambient temperature changes. This valve adjusts the pressure without allowing water, dust, or other contaminants inside the housing.

Inside the module, a light guide is secured and aligned between a respective photovoltaic cell and concentrating lens, preferably by an adhesive bond between the bottom surface of the light guide and the top surface of the photovoltaic cells and by a retaining member that is mechanically attached to interior surfaces of the sidewalls. In the preferred embodiment, the sidewalls contain a plurality of teeth protruding from the interior surface that grip the retaining member in an interference or snap fit. The retaining member has side edges that snap into place under the teeth as the retaining member is pushed in a downward direction over the top of the light guide. The retaining member includes a cut-out that is preferably shaped to correspond to a top portion of the light guide such that the top portion passes through the cut-out as the retaining member is lowered and snapped into place. The cut-out also defines a plurality of metal fingers in the corners of the cut-out. As the retaining member is pushed in a downward direction, its side edges are snapped into place under the teeth of the sidewalls, and its metal fingers are pushed upward by the corners of the top portion of the light guide. In the assembled configuration, the metal fingers act as springs and excerpt a downward retaining force on the light guide.

The concentrating lenses in the top panel are preferably Fresnel lenses, but not limited thereto, that receive solar radiation over a large surface area and channel it to the respective light guides. The light guide directs incident light onto the corresponding photovoltaic cell. In the preferred embodiment, the light guide operates to collimate, homogenize, and mix the incident light for output to the corresponding photovoltaic cell. The Fresnel lenses are designed to channel insolation at predetermined angles over a set distance, which, in conjunction with the light guides, focus insolation onto the photovoltaic cells' smaller surface areas at a much greater intensity. The light guide is preferably realized by a prism having the shape of an inverted pyramid with an entry aperture greater than that of the photovoltaic cell, whereby the incident light is directed to the photovoltaic cell by refraction at the sidewalls of the prism. A reflective coating can also be applied to the sidewalls of the prism in order to limit optical loss.

The photovoltaic module is assembled by bonding the array of photovoltaic cells to the base member, electronically coupling the photovoltaic cells in a desired configuration to an electrical output, and assembling the housing. The photovoltaic module provides a new mounting structure that helps to support the light guides of the module, as well as to maintain alignment with the corresponding photovoltaic cells. The mounting structure also counteracts the loading normally placed on the adhesive bonds between the array of light guides and the array of photovoltaic cells when the photovoltaic module is transported, moved, or rotated.

DETAILED DESCRIPTION OF THE PREFERRED EMBODIMENTS

Figure 1:
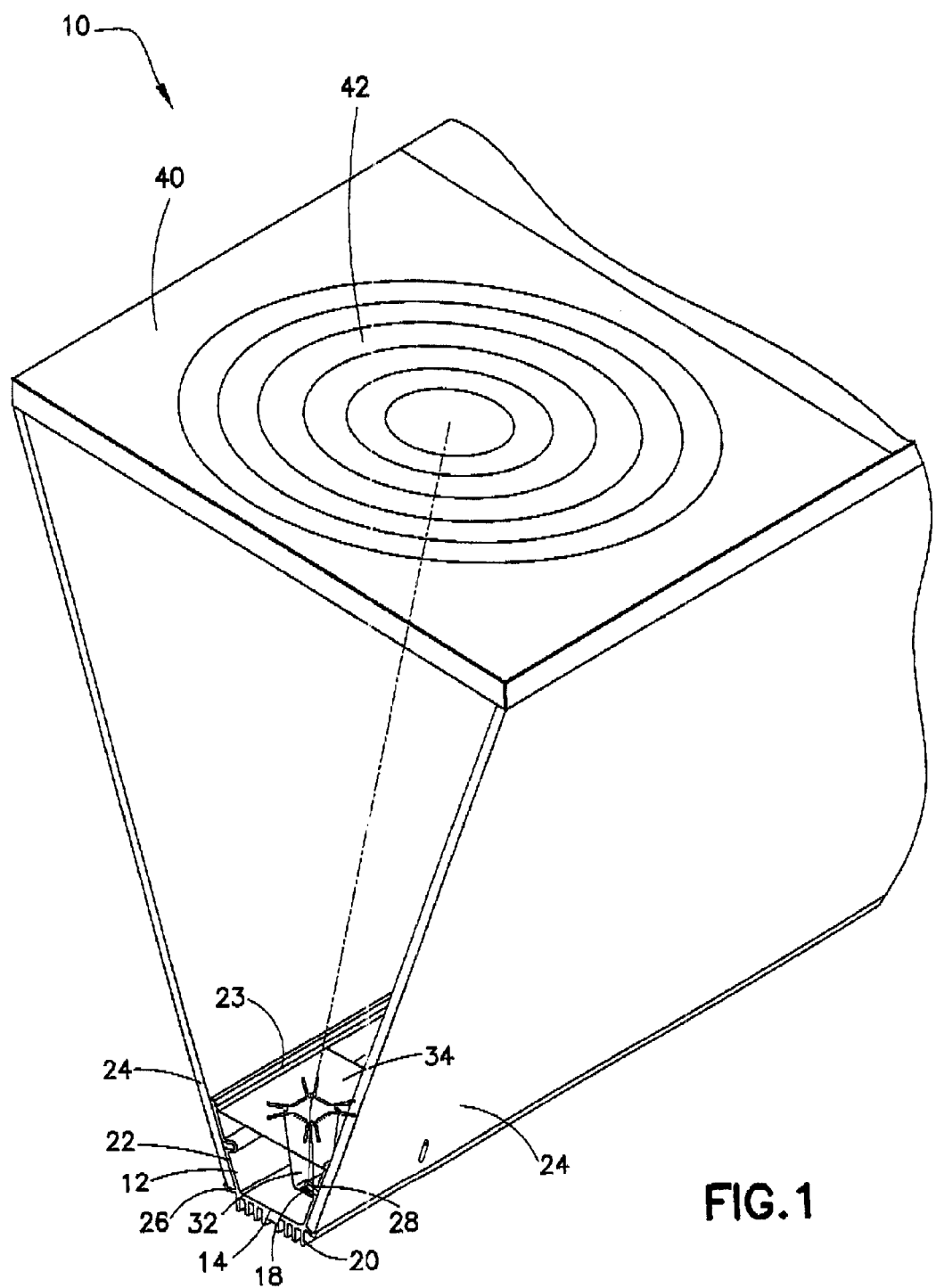
FIG. 1 is a partial-broken front perspective view of the concentrated solar photovoltaic module of the present invention.
Figure 1A:
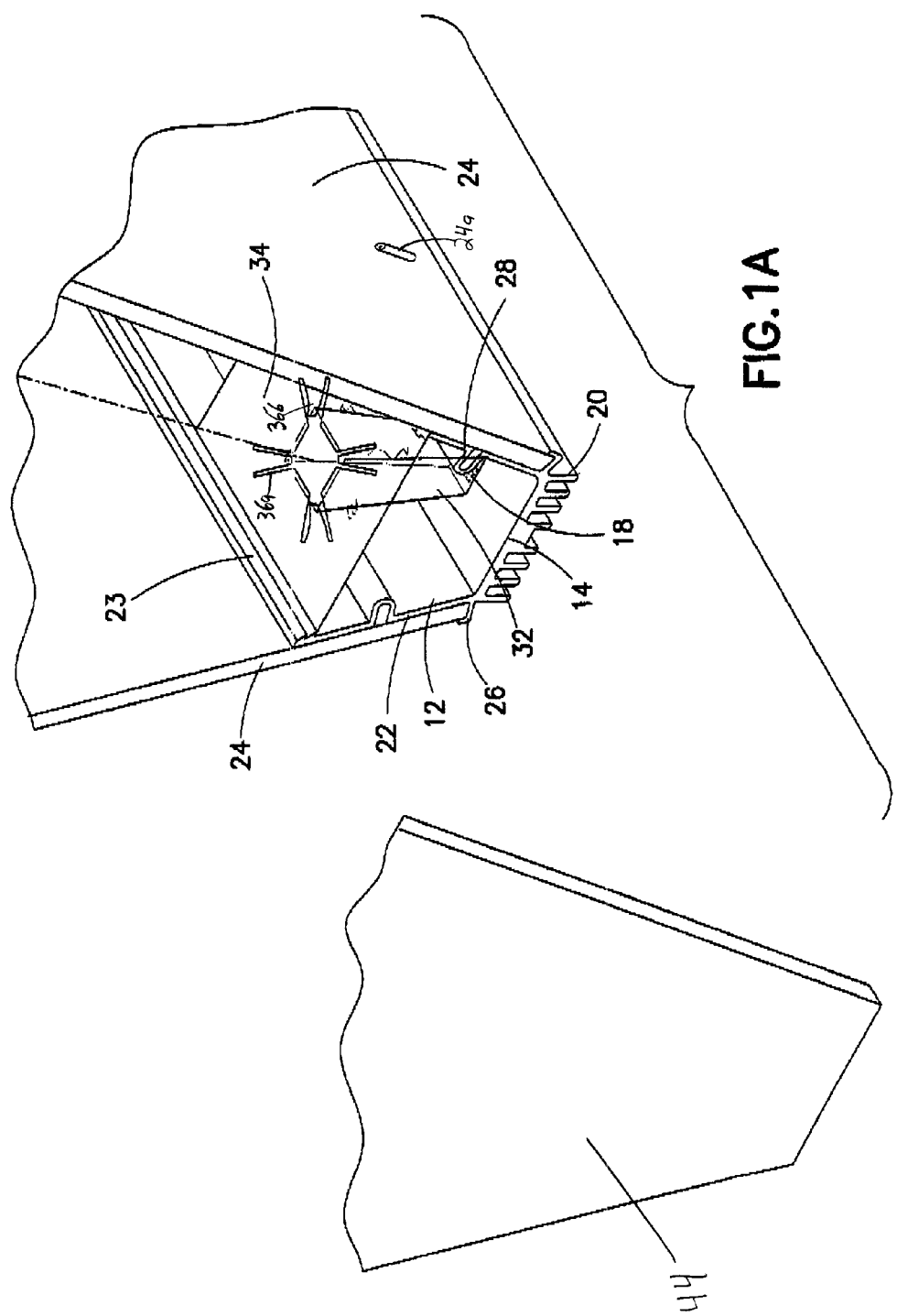
FIG. 1A is a broken-exploded front perspective view of the bottom portion of the concentrated solar photovoltaic module of FIG. 1 with an end panel that is secured thereto.
Figure 2:
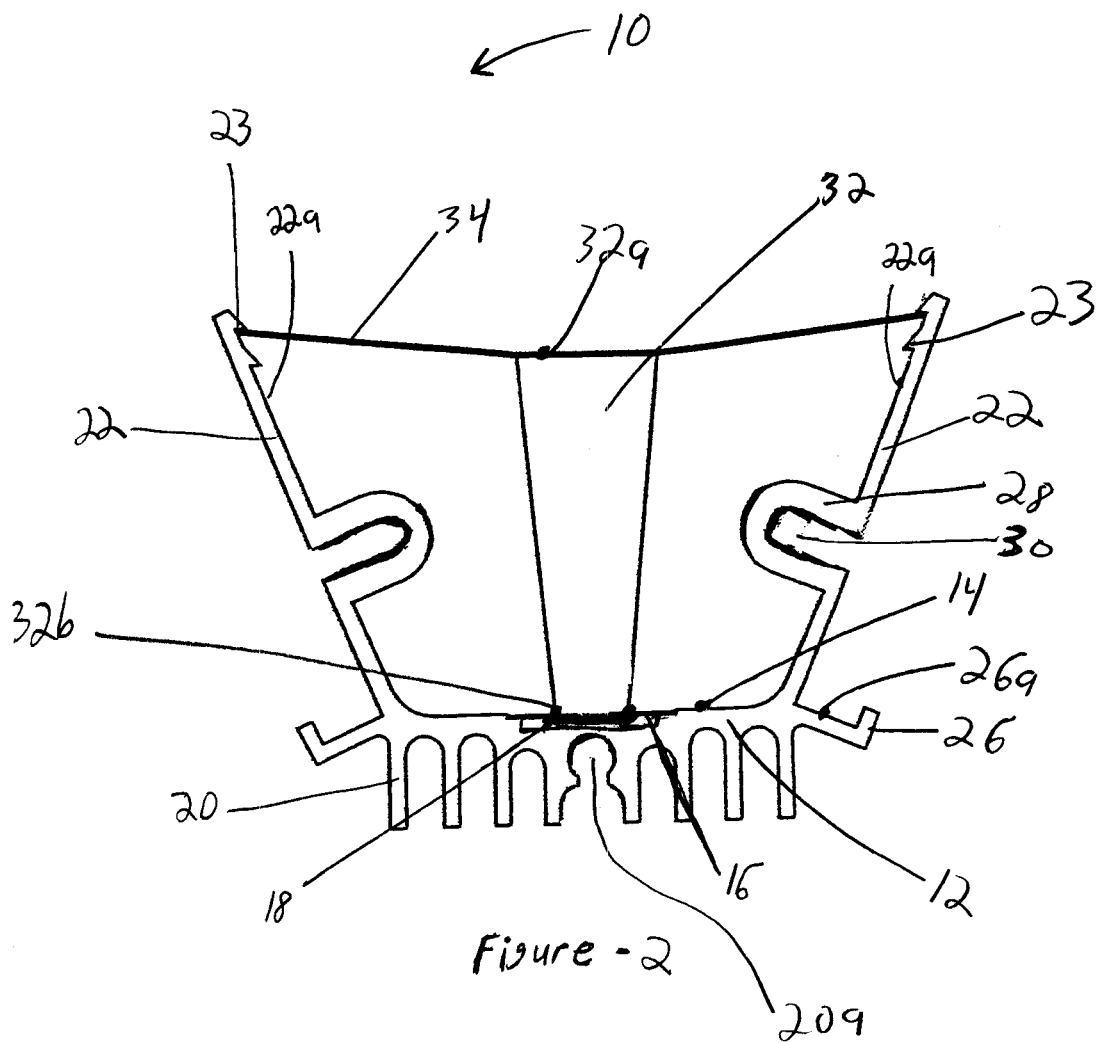
FIG. 2 is a front sectional view of the base member of the concentrated solar photovoltaic module of FIG. 1.
Figure 5:
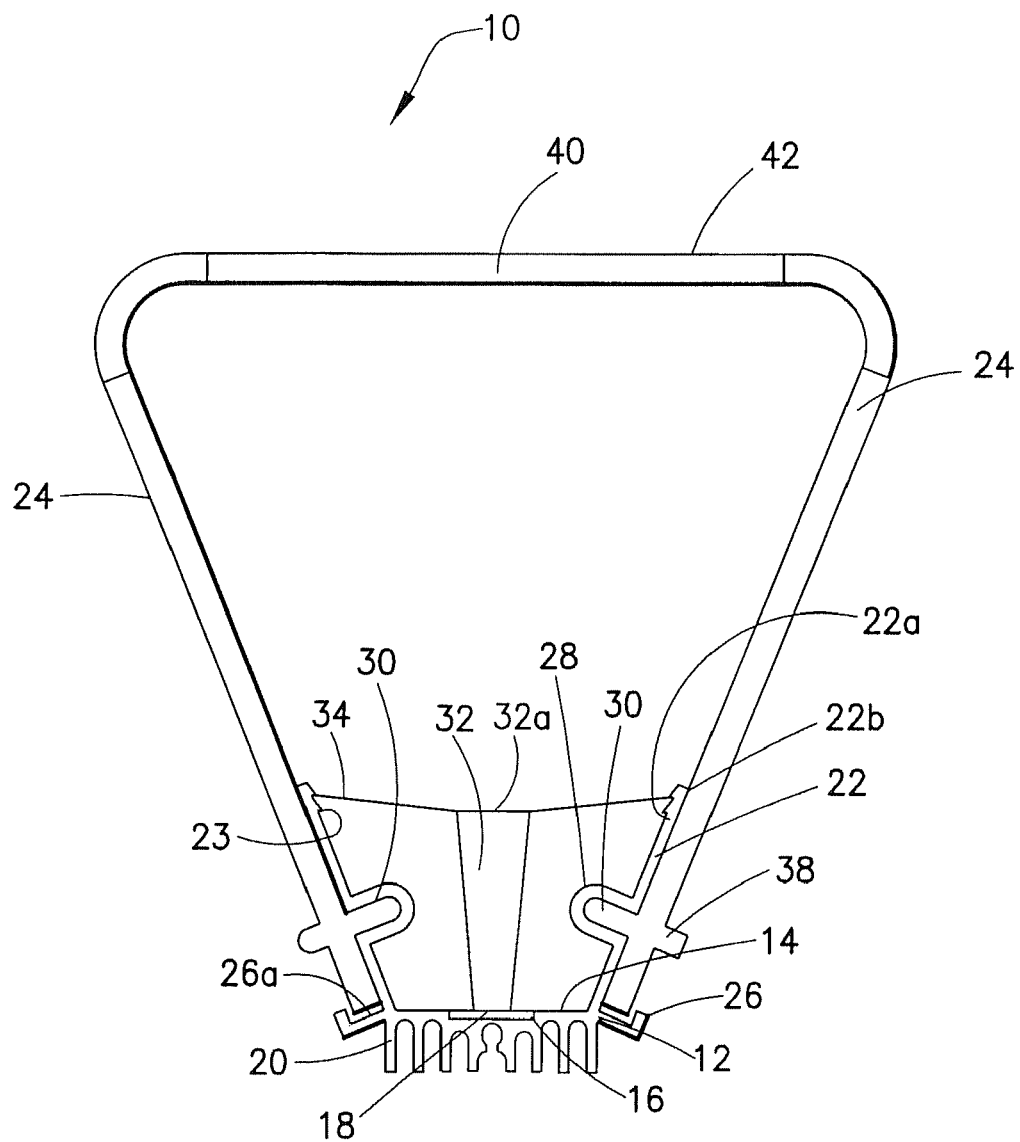
FIG. 5 is a front view of the assembled photovoltaic module of FIG. 1 without the end panel.

Referring to FIGS. 1, 1A, 2, and 5, shown is a concentrated solar photovoltaic module 10 of the present invention. FIG. 1 shows a front perspective view of the invention. FIG. 1A shows an enlarged view of a bottom portion of FIG. 1 with an end panel 44 shown in an exploded view. FIG. 2 shows an enlarged section view of a base member 12, photovoltaic cell 18, light guide 32, and retaining member 34 of FIG. 1. FIG. 5 shows a front section view of FIG. 2 with side panels 24 and a top panel 40 attached to the base member 12.

The base member 12 has a generally planar support surface 14. The support surface 14 contains one or more recesses 16 shaped to receive an array of photovoltaic cells 18 that are mounted therein preferably by double-sided thermally conductive tape. The photovoltaic cell 18 is a device that converts light energy into electrical energy. The photovoltaic cell 18 is typically realized by a photovoltaic integrated circuit together with a bypass diode and electrical interconnections mounted on a substrate. Other configurations can be used. The electrical outputs of the photovoltaic cells 18 are electronically connected to each other in a desired configuration (typically in a series or parallel configuration) by conductors supported by the base member 12. A plurality of cooling fins 20 extend down from the base member 12 opposite the support surface 14 along the length of the photovoltaic module 10. The cooling fins 20 are open to the atmosphere, and heat is therefore dissipated via convection. The cooling fins are preferably integrally formed with the base member 12, but may also be separately attached. Various types of photovoltaic cells 18, which convert solar insolation (sunlight) into electrical energy, can be employed, such as gallium arsenide photovoltaic cells, silicon photovoltaic cells, amorphous silicon photovoltaic cells, polycrystalline photovoltaic cells, micro-crystalline photovoltaic cells, photoelectrochemical cells, nanocrystal photovoltaic cells, and others. The base member 12 is preferably made by the extrusion of a thermally conductive material such as aluminum, but is not limited to thermally conductive materials.

The base member 12 also includes two side walls 22 that angularly extend from opposite edges of the support surface 14 for mechanically supporting a plurality of side panels 24 (FIGS. 1, 1A, 5). The side panels 24 mount parallel to the side walls 22. Two shoulders 26, are integrally formed and extend from the bottom of the side walls 22 to further assist with supporting the side panels 24. In one embodiment, the side walls 22 project upward from opposite edges of the support surface 14 at obtuse angles, preferably in a range between sixty and ninety degrees, and most preferably between sixty-three and seventy degrees. The shoulders 26 preferably project from the side walls 22 at right angles, which provides a support area 26a perpendicular to the bottom of the side panel 24 as it is mounted parallel to the side wall 22 (FIGS. 1A, 2).

The side panels 24 may be mounted to the side walls 22 at different heights depending on the distance desired between the top panel 40 and the support surface 14. At the lowest height allowed, the bottom of the side panels 24 would be supported by the support area 26a of the shoulders 26. In the preferred embodiment (FIG. 1), the side walls 22 include a rib 28 defining a channel 30 accessible for receiving self tapping screws or other fasteners for mounting the side panels 24 parallel to the side walls. The assembly of the side panels 24 is further discussed below with reference to FIG. 5.

Continuing with FIGS. 1 & 2, the base member 12 supports a light guide 32 that is mounted atop a corresponding photovoltaic cell 18 via an adhesive bond 32b. The light guide 32 directs incident light received from a plurality of concentrating lenses 42 onto the corresponding photovoltaic cell 18. In the preferred embodiment, the light guide 32 operates to collimate, homogenize, and mix the incident light received at its top portion 32a for output to the corresponding photovoltaic cell 18. The light guide 32 is preferably realized by a prism having the shape of an inverted pyramid with an entry aperture roughly four times that of the photovoltaic cell 18, whereby the incident light is directed to the photovoltaic cell 18 by refraction at the sidewalls of the prism. A reflective coating can also be applied to the sidewalls of the prism in order to limit optical loss. The prism is durable, thermally stable, and easily manufactured to yield low tolerances. The light guide 32 is also secured and aligned with a retaining member 34 placed over the top of the light guide 32. The retaining member 34 is preferably mechanically attached to the side walls 22 of the base 12 via a snap fit, interference fit, or other mechanical means.

Figure 3:
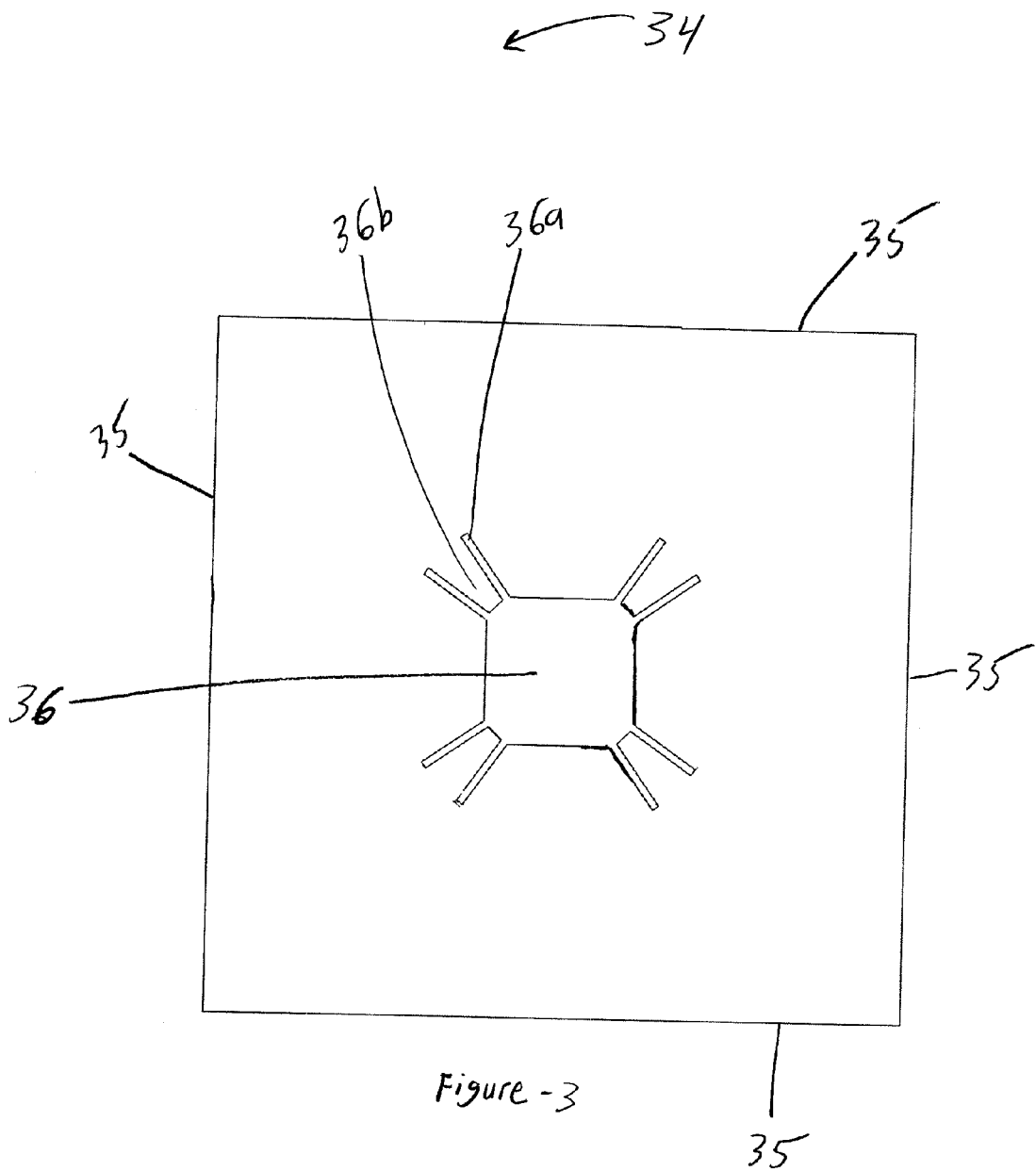
FIG. 3 is a top planar view of the retaining member of the concentrated solar photovoltaic module of FIG. 1.

Turning to FIG. 3, shown is a top planar view of an exemplary embodiment of the retaining member 34, which is realized by a thin plate of metal having a plurality of sides 35 and a centrally located cut-out 36. The cut-out 36 is shaped to receive the top portion 32a of the light guide 32 such that the top surface 32a will pass through the cut-out 36 as the retaining member 34 is placed over the light guide 32. While the light guide is preferably a prism in the shape of an inverted pyramid, other shapes could be used, and the cut-out 36 could be shaped accordingly. The cut-out 36 is also shaped to define a plurality of slots 36a that define a plurality of metal fingers 36b at the corner edges of the cut-out 36. These metal fingers 36b interface a plurality of corners 32b of the light guide 32 as the top portion 32a of the light guide 32 passes through the cut-out 36 (FIG. 3).

Figure 4:
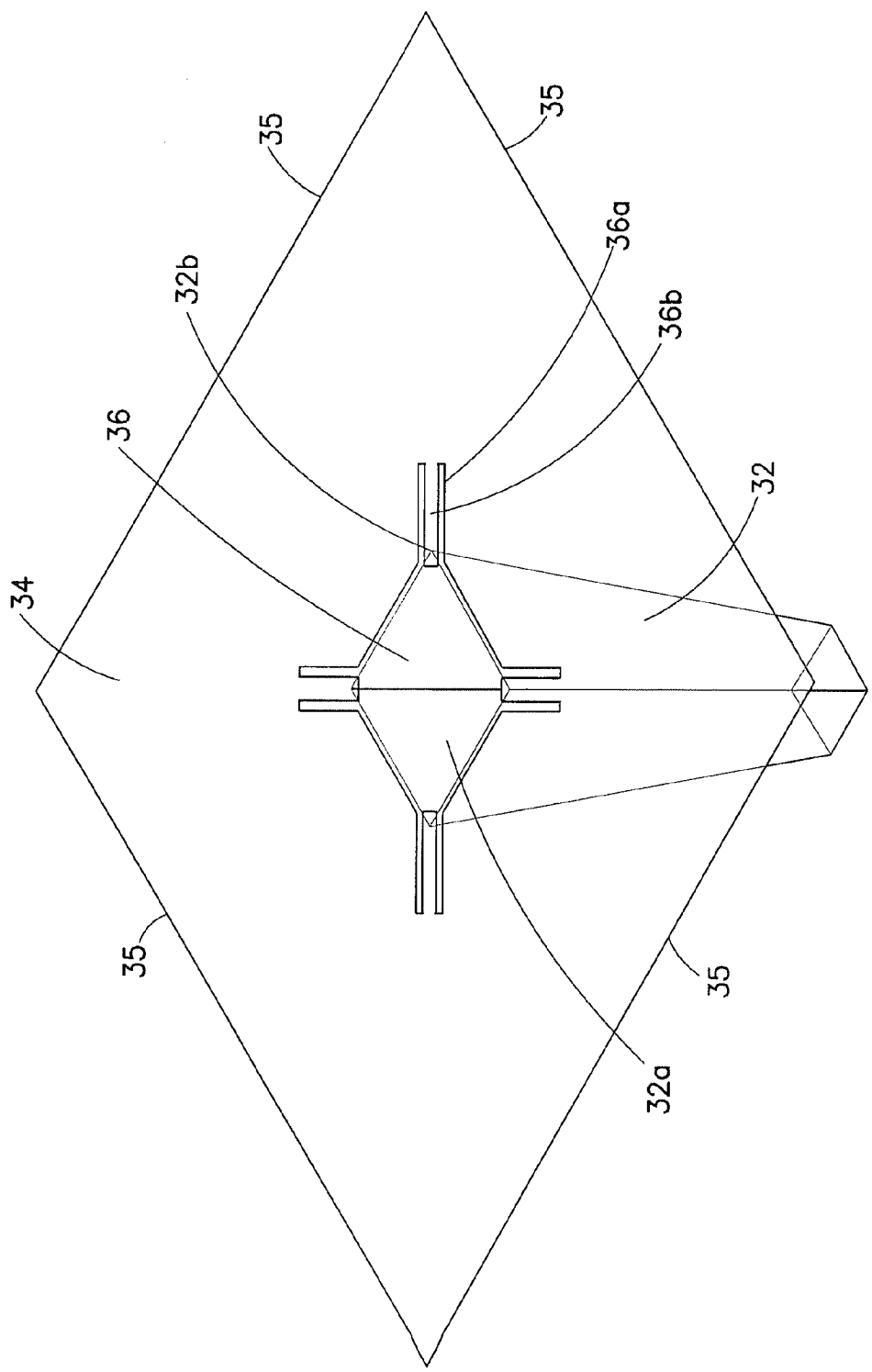
FIG. 4 is a top perspective view of the retaining member and prism of the concentrated solar photovoltaic module of FIG. 1.

Turning to FIG. 4, shown is a top perspective view of the retaining member 34 and light guide 32 of the concentrated solar photovoltaic module 10 of the present invention. The corners 32b of the light guide 32 contact the metal fingers 36b of the retaining member 34 as the retaining member 34 is pushed over the top of the light guide 32. The metal fingers 36b are pushed in an upward direction by the corners 32b such that when the retaining member 34 is fully in position, the metal fingers 36b are elevated with respect to the generally planar surface of the retaining member 34 but still contact the corners 32b.

Turning back to FIG. 2, the retaining member 34 is mechanically attached to the interior sides 22a of the side walls 22 of the base member 12. The side walls 22 contain a plurality of teeth 23 projecting from the interior sides 22a. These teeth 23 interface the sides 35 of the retaining member 34. As the retaining member 34 is pushed down onto the light guide 32, the sides 35 are snapped into place under the teeth 23.

In the preferred embodiment, the retaining member 34 is formed with slightly larger dimensions than the distance between opposing teeth 23 on respective opposing opposite side walls 22. As the retaining member 34 is pushed downward, it bends into a convex shape relative to the support surface 14 as its sides 35 curve in an upward direction underneath the opposing teeth 23. The teeth 23 project in a downward direction such that the opposing sides 35 of the retaining member 34 snap into gaps defined by adjacent teeth on the opposing side walls 22. The downward angle of the teeth 23 resists deflection of the retaining member 34 to a concave shape and thus aids in fixing the retaining member 34 in the desired convex shape. In the convex shape, the metal fingers 36b of the retaining member 34 contact the corners 32b of the light guide 32 and apply a biasing force downward toward the support surface 14 and the photovoltaic cells supported thereon (FIG. 3). In this manner, the light guide 32 is mechanically supported between the retaining member 34 and the corresponding photovoltaic cell. Such retaining forces mitigate or possibly eliminate the need for the adhesive bond between the photovoltaic cells 18 and the light guide 32. In addition, the cut-out 36 is preferably shaped such its edges touch or are in close proximity to the sides of the light guide 32 when placed into its concave configuration as described above. This configuration ensures alignment of the light guides 32 and also provides lateral stability to the light guides 32.

The teeth 23 may be located at different heights along the side walls 22 relative to the support surface 14 such that the retaining member 34 may be snapped into place at different heights depending on its length. As the sidewalls 22 angle downward towards the support surface 14, a retaining member 34 of a given length will experience a tighter and tighter fit as it is pushed downward on top of the light guide 32 because the distance between the sidewalls 22 decreases in that direction. This allows for greater manufacturing tolerances of the retaining member 34. The retaining member 34 can be manufactured at different lengths if the teeth 23 are formed to accommodate it at different heights and the fingers 36b are formed long enough such that they still interface the top corners of the light guide 32, even if a significant portion of it passes through the cavity 36.

Turning to FIG. 5, the side panels 24 are mounted to an exterior surface 22b of the side walls 22 and parallel to the side walls 22. A plurality of self tapping screws 38 or other fasteners pass through holes or slots 24a (FIG. 1A) in the side panels 24 and into the channels 30. Alternatively, holes may be drilled directly into the side walls 22 and set screws may be used to secure the side panels 24. The self tapping screws 38 may be loosened or removed, the side panels 24 slid along the length of the side walls 22, and the self tapping screws 38 reinserted through the holes of the side panels 24 and into the side walls 22. A top panel 40 containing an integral array of concentrating lenses 42 is attached and mounted to the side panels 24. The top panel 40 can be formed by bonding or mechanically fastening a number of lenses 42 together or by molding the lenses 42 together with as an integral lens array. The lens assembly is then secured by a support assembly (e.g., two side supports and two end supports) and sealed with a compound to provide both mechanical fastening and water tight sealing. The top panel 40 is then fastened to the side panels 24 with a plurality of self tapping screws or other fasteners, which are inserted through slots or holes in the top panel 40.

The fixation of the side panels 24 to the side walls 22 of the base member 12 through the use of the slots 24a, self tapping screws, or other equivalent means allows the height of the side panels 24, and thus the top panel 40, to be adjusted relative to the base member 12. The distance between the concentrating lenses 42 in the top panel 40 and the light guide 32 and photovoltaic cells 18 may therefore be varied as desired, and the focal point of the concentrating lens(es) 42 may be moved to ensure that the concentrating lenses 42 are focused to a desired part of the light guide 32.

The preferred configuration arranges the concentrating lenses 42 parallel to the corresponding array of photovoltaic cells 18. The concentrating lenses 42 are preferably Fresnel lenses, but can include other lenses known in the art that concentrate light (insolation) and focus it on a smaller surface area. The concentrating lenses 42 cooperate with the light guides 32 and photovoltaic cells 18 to convert insolation incident on the concentrating lenses 42 to electrical energy for output. The concentrating lenses 42 receive the insolation over a large surface area and channel it onto a smaller area at the top of the light guide 32. In the preferred embodiment, the array of light guides 32 collimate, homogenize, and mix the light received from the concentrating lenses 42 and focus it onto the corresponding photovoltaic cells' 18 smaller surface area at a much greater intensity.

Two end panels 44 are attached to the base member 12 at opposite ends. Two of the cooling fins 20 are formed to together define a channel 20a for receiving a self tapping screw. The end panels 44 are mounted perpendicular to the longitudinal axis 46 of the photovoltaic module 10 (FIG. 1). The end panels 44 are mounted to the module 10 at the base 12 by self tapping screws passing through the end panels 44 and into the channel 20a. The array of photovoltaic cells 18 and light guides 32 are thus enclosed by the base member 12, side panels 24, top panel 40, and end panels 44. Sealing adhesives are applied to the enclosed housing to keep out water, dust, or other particles. The housing also contains a valve (not shown) that regulates air pressure inside the housing in accordance with the atmospheric pressure, which varies as the ambient temperature changes. This valve adjusts the pressure without allowing water, dust, or other contaminants inside the housing.

Figure 6:
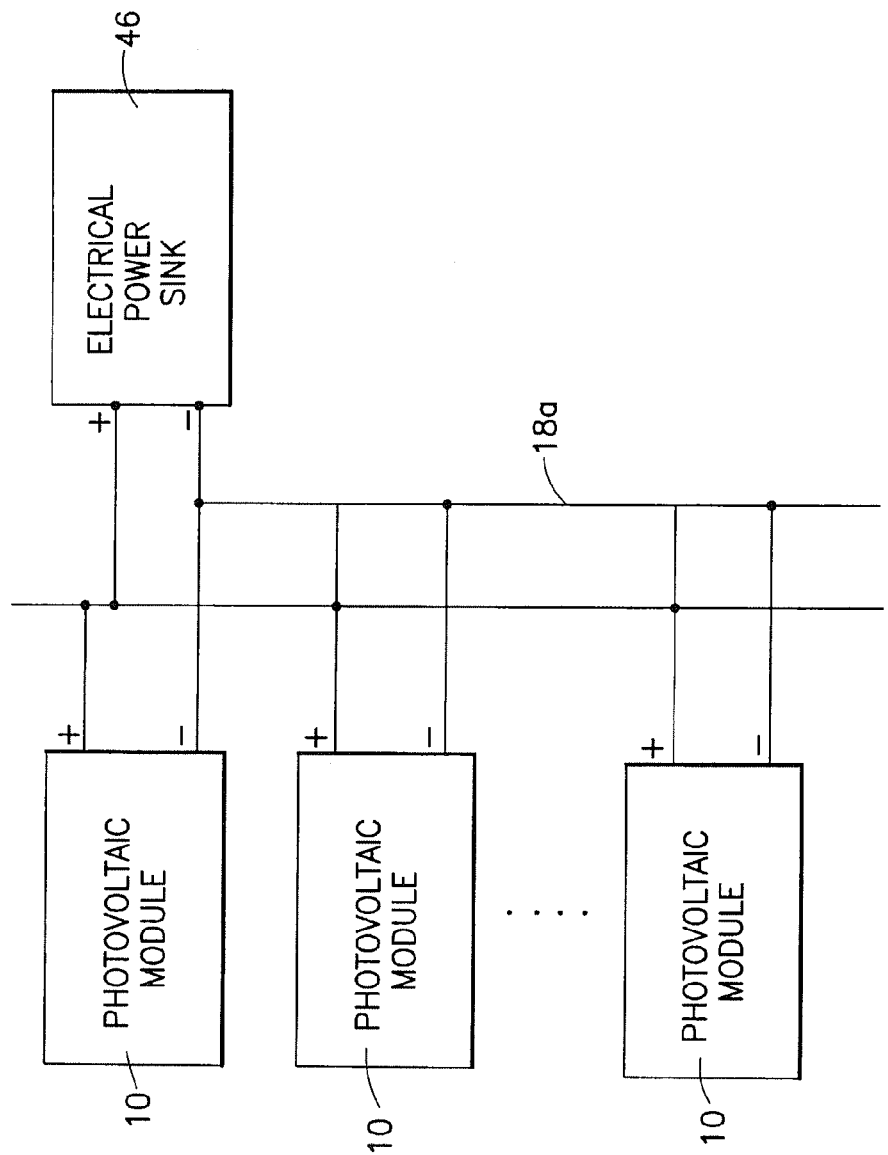
FIG. 6 is a schematic of an electrical power sink electronically coupled to a plurality of the photovoltaic modules of FIG. 1 arranged in parallel.

The photovoltaic module 10 is assembled by first bonding the array of photovoltaic cells 18 to the support surface 14 of the base member 12. The photovoltaic cells 18 are then electronically connected in a desired configuration (for example, preferably in parallel or in series with each other as shown in FIG. 6). The array of light guides 32 is then mounted to the base member 12 atop the array of photovoltaic cells 18 via a plurality of adhesive bonds 32c. The retaining member 34 is then lowered over the top surface 32a of the light guide 32 such that the top surface 32a passes through the cut-out 36 of the retaining member 34. The retaining member 34 is snapped into place by pushing down on the sides 35 until they snap under the teeth 23 on the interior surface 22a of the sidewall 22. The side panels 24, top panels 40 and end panels 44 are then installed as discussed above, and the module 10 is sealed to keep out water, dust, and other contaminants.

The structure of the photovoltaic module 10 supports and properly aligns the array of light guides 32 with the corresponding array of photovoltaic cells 18. The retaining members 34 provide lateral stability to the light guide 32 and will absorb some of the lateral forces present when the photovoltaic module is transported, moved, or rotated. The retaining members 34 also restrict the assembly tolerances of the light guide 32 relative to the photovoltaic cells 18 during installation, which allows for more accurate alignment in the field.

Turning to FIG. 6, shown is an array of photovoltaic modules 10 whose electrical outputs are coupled in parallel with each other and to an electrical power sink 46. The electrical power sink 46 can be a DC/AC inverter and possibly a battery bank for energy storage. The DC/AC inverter converts the electrical energy outputted by the photovoltaic module 10 (in the form of DC current) into AC current for energy supply applications. The battery bank stores the electrical energy outputted by the photovoltaic modules 10 for energy supply applications. Note that the electrical outputs of the photovoltaic modules 10 can be arranged in different configurations, such as a series configuration or hybrid parallel-series configuration as desired.

There have been described and illustrated herein several embodiments of a photovoltaic system, a module for housing and securing a plurality of photovoltaic cells and reflector assemblies, and methods of assembling a photovoltaic system. While particular embodiments of the invention have been described, it is not intended that the invention be limited thereto, as it is intended that the invention be as broad in scope as the art will allow and that the specification be read likewise. Thus, while particular materials, dimensions, fasteners, reflectors, lenses, etc. have been disclosed, it will be appreciated that other suitable substitutes can be used as well. While the embodiment of the present invention discloses a light guide mounted directly on a corresponding photovoltaic cell with an adhesive bond, it will be appreciated by those skilled in the art that the light guide could be mounted above the photovoltaic cell without any adhesive bonds. In addition, while a retaining member mounted to the side walls of the base has been disclosed, it will be appreciated that the retaining member could be mounted to the side panels instead. Further, while the preferred embodiment discloses a single top panel containing concentrating lenses as part of the photovoltaic module, it will be appreciated that a plurality of top panels, each containing one or more concentrating lenses, may be integrated together as part of the photovoltaic module. It will also be appreciated that a tube containing a thermally conductive fluid may be secured to or integrated into the base member in order to scavenge the heat production of the photovoltaic cells for use as a source of heat for additional applications. In addition, while the preferred embodiment discloses a prism in the shape of an inverted pyramid with a corresponding retaining member having a cut-out shaped to receive it, it will be appreciated by those skilled in the art that other shapes and elements may be used for the light guides and the corresponding retaining members and parts thereof. It will be appreciated by those skilled in the art that these and other modifications could be made to the provided invention without deviating from its spirit and scope as claimed.

What is claimed is:

1. A solar photovoltaic module, comprising:
    a housing including a base member having a generally planar support surface and two side walls projecting from said support surface; two side panels detachably connected to said side walls; and a top panel detachably connected to said side panels, said top panel including an array of concentrating lenses;
    an array of photovoltaic cells corresponding to said array of concentrating lenses and supported by said support surface;
    an array of light guides disposed between said array of concentrating lenses and said array of photovoltaic cells, each light guide having a top surface, wherein, said array of concentrating lenses and said corresponding light guides cooperate to direct light onto said photovoltaic cells; and
    at least one retaining member that interfaces to said top surfaces of said array of light guides and defines cut-out regions shaped to receive said top surfaces, said cut-out regions allowing light directed from said concentrating lenses to enter said top surfaces of said light guides for propagation through said light guides to said photovoltaic cells,
    wherein, said at least one retaining member applies a downward biasing force to said top surfaces of said light guides toward said array of photovoltaic cells to sandwich said array of light guides between said at least one retaining member and said array of photovoltaic cells such that said array of light guides maintain contact with said array of photovoltaic cells.

2. A solar photovoltaic module according to claim 1, wherein:
    said photovoltaic cells are realized from a semiconductor light-absorbing material.

3. A solar photovoltaic module according to claim 1, wherein:
    said array of concentrator lenses are Fresnel lenses.

4. A solar photovoltaic module according to claim 3, wherein:
    said corresponding array of light guides are prisms.

5. A solar photovoltaic module according to claim 4, wherein:
    said prisms are in the shape of a truncated inverted pyramid.

6. A solar photovoltaic module according to claim 1, wherein:
    said top surface of a respective light guide has a plurality of corners, and said at least one retaining member defines a plurality of elongate fingers that interface to corresponding corners of said respective light guide.

7. A solar photovoltaic module according to claim 1, wherein:
    said sidewalls comprise a plurality of teeth for mechanically engaging said at least one retaining member such that each retaining member is securely mounted to said sidewalls within said base.

8. A solar photovoltaic module according to claim 7, wherein:
said sidewalls have an interior surface, said at least one retaining member has a plurality of sides, and said teeth project angularly downward from said interior surface such that said teeth define a gap between said teeth and said interior surface, and said gap receives at least one of said plurality of sides of each retaining member.

9. A solar photovoltaic module according to claim 6, wherein:
said side panels comprise a plurality of teeth projecting inward for gripping said at least one retaining member such that each retaining member is securely mounted to said side panels by an interference fit.

10. A solar photovoltaic module according to claim 1, wherein:
said side walls comprise a plurality of shoulders projecting outward for supporting said side panels, and a plurality of teeth projecting inward for gripping said at least one retaining member such that each retaining member is securely mounted to said side walls by an interference fit.

11. A solar photovoltaic module according to claim 9, wherein:
said side walls further comprise a rib defining an accessible channel shaped to receive a plurality of self tapping screws that mount said side panel to said side wall.

12. A solar photovoltaic module according to claim 1, wherein:
said base member further comprises a plurality of cooling fins extending downward from said support surface for diffusing heat away from said array of photovoltaic cells.

13. A solar photovoltaic module according to claim 1, wherein:
said base member further defines at least one recess shaped to receive at least one of said corresponding photovoltaic cells, and said photovoltaic cells are mounted to said recesses by a plurality of adhesive bonds.

14. A solar photovoltaic module according to claim 1, wherein:
each of said side walls forms an obtuse angle with respect to said generally planar support surface.

15. A solar photovoltaic module according to claim 1, wherein:
said housing includes a plurality of top panels detachably connected to said side panels, each top panel having an array of concentrating lenses.

16. A solar photovoltaic module according to claim 1, wherein:
said side panels include a means for adjusting the vertical position of said side panels relative to said base member such that the focal point of said concentrating lenses is moveable to ensure that said concentrating lenses are focused on corresponding light guides.

17. A solar photovoltaic module according to claim 1, further comprising:
at least one adhesive bond between said array of light guides and said array of photovoltaic cells, wherein, said light guides are mounted atop said photovoltaic cells and attached thereto by said at least one adhesive bond.

18. A solar photovoltaic module comprising:
a base member having a generally planar support surface and two side walls projecting from said support surface at obtuse angles with respect to said support surface, wherein, said support surface defines at least one recess for receiving a plurality of photovoltaic cells, and comprises a plurality of fins projecting downward from said support surface for diffusing heat away from said photovoltaic cells, and wherein said side walls comprise a plurality of shoulders projecting outward for supporting two side panels, said side panels being detachably connected to said side walls, and a plurality of teeth projecting inward;
a top panel detachably connected to said side panels, said top panel having an integral array of Fresnel lenses;
an array of photovoltaic cells mounted to said at least one recess;
an array of prisms corresponding and mounted to said array of photovoltaic cells by a plurality of adhesive bonds, wherein each prism includes a top portion having a plurality of corners; and
at least one retaining member supported by said side walls, said at least one retaining member defining cutout regions for receiving said top portions of said array of prisms and a plurality of metal fingers that interface to said corners of a respective prism, said cut-out regions allowing light directed from said concentrating lenses to enter said top portions of said prisms for propagation through said prisms to said photovoltaic cells, said plurality of metal fingers applying a downward biasing force to a top surface of said respective prism toward said photovoltaic cells to sandwich said respective prism between said at least one retaining member and said photovoltaic cells to position and align said respective prism above a respective photovoltaic cell and to maintain contact between said respective prism and said respective photovoltaic cell.

19. A solar photovoltaic system, comprising:
at least one photovoltaic module and an electrical power sink electronically coupled to said at least one photovoltaic module,
wherein said at least one photovoltaic module includes
a housing including a base member having a generally planar support surface and two side walls projecting from said support surface, two side panels detachably connected to said side walls, and a top panel detachably connected to said side panels, said top panel including an array of concentrating lenses,
an array of photovoltaic cells corresponding to said array of concentrating lenses and mounted to said support surface, and
an array of light guides disposed between said array of concentrating lenses and said array of photovoltaic cells, wherein, said array of concentrating lenses and said corresponding light guides work together to direct light onto said photovoltaic cells; and
at least one retaining member supported by said side walls that interfaces to said array of light guides and applies a downward biasing force to top surfaces of said light guide toward said array of photovoltaic cells to maintain contact therebetween.

20. A solar photovoltaic system according to claim 19, wherein:
each light guide includes a top surface and each retaining member defines a cut-out shaped to receive said top surface, said cut-out allowing light directed from said concentrating lenses to enter said light guide for propagation through said light guide to a corresponding photovoltaic cell.

21. A solar photovoltaic system according to claim 19, wherein:
said electrical power sink comprises at least one of a DC/AC inverter and a battery bank.

22. A solar photovoltaic module, comprising:

a housing including a base member having a generally planar support surface and two side walls projecting from said support surface; two side panels detachably connected to said side walls; and a top panel detachably connected to said side panels, said top panel including an array of concentrating lenses;

an array of photovoltaic cells corresponding to said array of concentrating lenses and supported by said support surface;

an array of light guides disposed between said array of concentrating lenses and said array of photovoltaic cells, wherein, said array of concentrating lenses and said corresponding light guides work together to direct light onto said photovoltaic cells;

at least one retaining member that interfaces to said array of light guides and applies a downward biasing force to top surfaces of said light guides toward said array of photovoltaic cells in order to sandwich said array of light guides between said at least one retaining member and said array of photovoltaic cells and maintain contact therebetween; and a coupling means for removably attaching said side panels to said base member in order to adjust the vertical position of said side panels relative to said base member to thereby adjust the vertical position of said concentrating lenses relative to said light guides.

23. A solar photovoltaic module according to claim 1, wherein:

in an installed position, said at least one retaining member has a convex shape relative to said support surface.

24. A solar photovoltaic module according to claim 18, wherein:

in an installed position, said at least one retaining member has a convex shape relative to said support surface.

25. A solar photovoltaic module according to claim 19, wherein:

in an installed position, said at least one retaining member has a convex shape relative to said support surface.

26. A solar photovoltaic module according to claim 22, wherein:

in an installed position, said at least one retaining member has a convex shape relative to said support surface.

* * * * *